(12) United States Patent
Min et al.

(10) Patent No.: US 9,570,457 B2
(45) Date of Patent: Feb. 14, 2017

(54) METHOD TO CONTROL THE COMMON DRAIN OF A PAIR OF CONTROL GATES AND TO IMPROVE INTER-LAYER DIELECTRIC (ILD) FILLING BETWEEN THE CONTROL GATES

(71) Applicant: Taiwan Semiconductor Manufacturing Co., Ltd., Hsin-Chu (TW)

(72) Inventors: Chung-Chiang Min, Zhubei (TW); Tsung-Hsueh Yang, Taichung (TW); Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/468,410

(22) Filed: Aug. 26, 2014

(65) Prior Publication Data

US 2016/0064401 A1 Mar. 3, 2016

(51) Int. Cl.
*H01L 27/115* (2006.01)
*H01L 29/792* (2006.01)
(Continued)

(52) U.S. Cl.
CPC ..... *H01L 27/11568* (2013.01); *H01L 21/0337* (2013.01); *H01L 21/28282* (2013.01); *H01L 21/31051* (2013.01); *H01L 21/31111* (2013.01); *H01L 29/42344* (2013.01); *H01L 29/66833* (2013.01); *H01L 29/792* (2013.01)

(58) Field of Classification Search
CPC ................ H01L 27/11568; H01L 29/66833; H01L 29/42344; H01L 29/792; H01L 21/0337; H01L 21/31111; H01L 21/31051; H01L 21/28282
See application file for complete search history.

(56) References Cited

U.S. PATENT DOCUMENTS

| 6,168,995 | B1 * | 1/2001 | Kelley | H01L 29/42328 257/E21.422 |
| 7,667,261 | B2 * | 2/2010 | Hsieh | H01L 27/115 257/316 |

(Continued)

*Primary Examiner* — Dale E Page
*Assistant Examiner* — Vincent Wall
(74) *Attorney, Agent, or Firm* — Eschweiler & Associates, LLC

(57) ABSTRACT

A semiconductor structure for a split gate flash memory cell device with a hard mask having an asymmetric profile is provided. A semiconductor substrate of the semiconductor structure includes a first source/drain region and a second source/drain region. A control gate and a memory gate, of the semiconductor structure, are spaced over the semiconductor substrate between the first and second source/drain regions. A charge trapping dielectric structure of the semiconductor structure is arranged between neighboring sidewalls of the memory gate and the control gate, and arranged under the memory gate. A hard mask of the semiconductor structure is arranged over the control gate and includes an asymmetric profile. The asymmetric profile tapers in height away from the memory gate. A method for manufacturing a pair of split gate flash memory cell devices with hard masks having an asymmetric profile is also provided.

20 Claims, 8 Drawing Sheets

(51) Int. Cl.
*H01L 29/66* (2006.01)
*H01L 21/28* (2006.01)
*H01L 21/033* (2006.01)
*H01L 21/311* (2006.01)
*H01L 21/3105* (2006.01)
*H01L 29/423* (2006.01)

(56) References Cited

U.S. PATENT DOCUMENTS

| | | | | |
|---|---|---|---|---|
| 8,395,203 B2* | 3/2013 | Chakihara | .......... | G11C 16/0466 257/316 |
| 8,461,642 B2* | 6/2013 | Homma | .................. | H01L 27/11 257/324 |
| 8,951,864 B2* | 2/2015 | Wang | ................ | H01L 21/28273 257/624 |
| 2002/0041526 A1* | 4/2002 | Sugita | ................ | G11C 16/0475 365/200 |
| 2004/0248367 A1* | 12/2004 | Shyu | ..................... | H01L 27/115 438/257 |
| 2007/0155153 A1* | 7/2007 | Okazaki | ............ | H01L 21/28282 438/597 |
| 2009/0273014 A1* | 11/2009 | Arigane | ............ | H01L 27/11568 257/315 |
| 2010/0270605 A1* | 10/2010 | Choi | ................. | H01L 21/28273 257/316 |
| 2015/0048439 A1* | 2/2015 | Shum | ................. | H01L 29/7816 257/326 |

\* cited by examiner

METHOD TO CONTROL THE COMMON DRAIN OF A PAIR OF CONTROL GATES AND TO IMPROVE INTER-LAYER DIELECTRIC (ILD) FILLING BETWEEN THE CONTROL GATES

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cells, typically made from floating gate transistors. Common types of flash memory cells include stacked gate memory cells and split gate memory cells. Split gate memory cells have several advantages over stacked gate memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
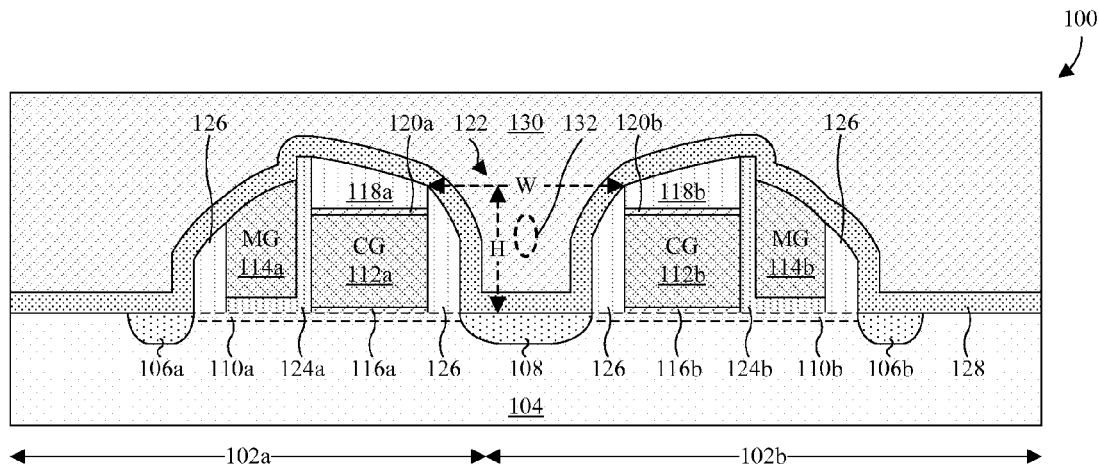
FIG. 1 illustrates a cross-sectional view of some embodiments of a semiconductor structure for a pair of split gate flash memory cells with hard masks having asymmetric profiles.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. For example, "a first substrate" described in connection with FIG. 1 may not correspond to "a first substrate" described in connection with FIG. 3.

Common types of split gate flash memory cell devices include silicon-oxide-nitride-oxide-silicon (SONOS) split gate flash memory cell devices and metal-oxide-nitride-oxide-silicon (MONOS) split gate flash memory cell devices. The semiconductor structure of a SONOS or MONOS split gate flash memory cell device includes a memory gate and a control gate spaced over a top surface of a semiconductor substrate between a source region and a drain region embedded in the top surface of the semiconductor substrate. Further, arranged between neighboring sidewalls of the memory gate and the control gate, and extending under the memory gate between the semiconductor substrate and the memory gate, the semiconductor structure includes a charge trapping dielectric structure. The charge trapping dielectric structure stores a variable amount of charge corresponding to a stored data value. Through selective biasing of the memory gate and the control gate, the amount of stored charge and the data value can be varied.

Typically, SONOS or MONOS split gate flash memory cell devices are formed in pairs. According to some methods to forming the semiconductor structure for a pair of SONOS or MONOS split gate flash memory cell devices, a pair of control gates and corresponding hard masks having symmetrical profiles are formed spaced over a semiconductor substrate. A charge trapping dielectric layer is then conformally formed over the control gates and the semiconductor substrate. Further, a pair of memory gates corresponding to the pair of control gates is formed over and laterally abutting the charge trapping dielectric layer outside a central region between the control gates. Subsequent to forming the memory gates, the central region is cleared to the semiconductor substrate and a main sidewall structure is formed in the central region along opposing sidewalls of the control gates. Further, a common drain region is implanted in the central region between the main sidewall structure, and an inter-layer dielectric (ILD) layer filling the central region is formed. With the ILD layer formed, a planarization is performed through the hard masks to the control gates.

A challenge with forming the SONOS or MONOS split gate flash memory cell devices as described above is that the central region between the control gates has a high aspect ratio (i.e., a ratio of height to width greater than or equal to about one). As such, filling issues can occur during the formation of the ILD layer. Namely, a void can form in the central region, which can lead to piping defects and malfunction of the split gate flash memory cell devices. Another challenge with forming the SONOS or MONOS split gate flash memory cell devices as described above is that the central region is defined by lithography and etching. This introduces variations into the size of the central region during the bulk manufacture of the split gate flash memory cell devices and can lead to device failure.

In view of the foregoing, the present disclosure is directed to an improved method of forming a pair of SONOS or MONOS split gate flash memory cell devices. In contrast with the above described method, the improved method forms the split gate flash memory cell devices with hard masks having asymmetric profiles. These asymmetric profiles advantageously reduce the aspect ratio of the central region between the control gates to reduce the likelihood of ILD filling issues. Further, in contrast with the above described method, the improved method employs spacers to define the central region between the control gates. The spacers advantageously allow the central region to be more consistently and accurately defined during the bulk manufacture of split gate flash memory cell devices. This is increasingly important as split gate flash memory cell devices reach smaller and smaller sizes.

With reference to FIG. 1, a cross-sectional view 100 of some embodiments of a semiconductor structure of according to aspects of the present disclosure is provided. The semiconductor structure includes a pair of memory cell devices 102a, 102b, including a first memory cell device 102a and a second memory cell device 102b, arranged over and/or within a semiconductor substrate 104. The memory cell devices 102a, 102b store data in a nonvolatile manner and are, for example, MONOS or SONOS split gate flash memory cell devices. The semiconductor substrate 104 is, for example, a bulk substrate of silicon, germanium, or group III and group V elements. Alternatively, the semiconductor substrate 104 is, for example, a semiconductor-on-insulator (SOI) substrate.

Embedded within a top surface of the semiconductor substrate 104, the semiconductor structure includes source/drain regions 106a, 106b, 108 corresponding to the memory cell devices 102a, 102b. In some embodiments, the source/drain regions 106a, 106b, 108 include a pair of individual source/drain regions 106a, 106b corresponding to the memory cell devices 102a, 102b and a common source/drain region 108 arranged between the individual source/drain regions 106a, 106b. The individual source/drain regions 106a, 106b are, for example, source regions, and the common source/drain region 108 is, for example, a drain region. The source/drain regions 106a, 106b, 108 are spaced over the top surface to define channel regions 110a, 110b corresponding to the memory cell devices 102a, 102b between corresponding pairs of source/drain regions 106a, 106b, 108. In some embodiments, each channel region 110a, 110b spans between a corresponding individual source/drain region 106a, 106b and the common source/drain region 108.

Over each channel region 110a, 110b, a memory cell device 102a, 102b includes a control gate 112a, 112b and a memory gate 114a, 114b spaced between the source/drain regions 106a, 106b, 108 of the channel region 110a, 110b. In some embodiments, the control gate 112a, 112b is arranged proximate to a source/drain region 108 shared with another memory cell device 102a, 102b, and the memory gate 114a, 114b is arranged proximate to a source/drain region 106a, 106b individual to the memory cell device 102a, 102b. Where the memory cell device 102a, 102b is a SONOS memory cell device, the control and memory gates 112a, 112b, 114a, 114b are typically polysilicon, and where the memory cell device 102a, 102b is a MONOS memory cell device, the control and memory gates 112a, 112b, 114a, 114b are typically metal.

Electrically isolating the control gate 112a, 112b from the semiconductor substrate 104, a control gate dielectric structure 116a, 116b of the memory cell device 102a, 102b is arranged between the control gate 112a, 112b and the semiconductor substrate 104. Further, a hard mask 118a, 118b of the memory cell device 102a, 102b is arranged over the control gate 112a, 112b, and a hard mask dielectric structure 120a, 120b of the memory cell device 102a, 102b is arranged between the hard mask 118a, 118b and the control gate 112a, 112b to electrically isolate the hard mask 118a, 118b from the control gate 112a, 112b. In contrast with a hard mask of a traditionally formed memory cell device, the hard mask 118a, 118b of the present disclosure is not removed. The hard mask 118a, 118b has an asymmetrical profile reducing in height away from the memory gate 114a, 114b. As explained hereafter, this advantageously reduces the ratio of height H to width W (i.e., the aspect ratio) of a central region 122 between neighboring memory cell devices 102a, 102b to less than one. In some embodiments, the width W corresponds to the distance between neighboring sidewalls of the control gates 112a, 112b, and the height H corresponds to the distance between a top surface of the semiconductor substrate 104 and the lowest point of the top surface of the hard masks 118a, 118b. The control and hard mask gate dielectrics 116a, 116b, 120a, 120b are, for example, an oxide, such as silicon dioxide, and the hard mask 118a, 118b is, for example, silicon nitride.

Electrically isolating the memory gate 114a, 114b from the semiconductor substrate 104, a charge trapping dielectric structure 124a, 124b is arranged between the semiconductor substrate 104 and the memory gate 114a, 114b. The charge trapping dielectric structure 124a, 124b further extends vertically up between neighboring sidewalls of the memory gate 114a, 114b and the control gate 112a, 112b to electrically isolate the memory gate 114a, 114b from the control gate 112a, 112b and the hard mask 118a, 118b. The charge trapping dielectric structure 124a, 124b is, for example, a multilayer oxide-nitride-oxide (ONO) film or a multilayer oxide-silicon dot-oxide (OSiO) film.

A main sidewall structure 126 is arranged on sidewalls of the memory cell devices 102a, 102b, and a contact etch stop layer 128 is arranged conformally over the semiconductor substrate 104, the main sidewall structure 126, and the memory cell devices 102a, 102b. Further, an ILD layer 130 is arranged over the contact etch stop layer 128 to fill the central region 122. Advantageously, because the aspect ratio of the central region 122 is less than one, the likelihood of a void 132 forming in the central region 122 during the formation of the ILD layer 130 is minimized. This, in turn, minimizes the likelihood of piping defects and malfunction of the memory cell devices 102a, 102b. The main sidewall structure 126 and the contact etch stop layer 128 are, for example, a dielectric, such as silicon nitride, and he ILD layer 130 is, for example, a dielectric, such as silicon oxide.

In operation, each memory cell device 102a, 102b stores a variable amount of charge, such as electrons, in the charge trapping dielectric structure 124a, 124b. The charge is advantageously stored in a non-volatile manner so that the stored charge persists in the absence of power. The amount of charge stored in the charge trapping dielectric structure 124a, 124b represents a value, such as binary value, and is varied through program (i.e., write), read, and erase operations. These operations are performed through selective biasing of the control gate 112a, 112b and the memory gate 114a, 114b.

During a program or erase operation of a memory cell device 102a, 102b, the memory gate 114a, 114b is forward or reversed biased with a high (e.g., at least an order of magnitude higher) voltage relative a voltage applied across the channel region 110a, 110b and/or relative to a voltage applied to the control gate 112a, 112b. In some embodiments, forward biasing is used for a program operation, and reverse biasing is used for an erase operation. During a program operation, the high bias voltage promotes Fowler-Nordheim tunneling of carriers from the channel region 110a, 110b towards the memory gate 114a, 114b. As the carriers tunnel towards the memory gate 114a, 114b, the carriers become trapped in the charge trapping dielectric structure 124a, 124b. During an erase operation, the high bias voltage promotes Fowler-Nordheim tunneling of carriers in the charge trapping dielectric structure 124a, 124b away from the memory gate 114a, 114b. As the carriers tunnel away from the memory gate 114a, 114b, the carriers become dislodged or otherwise removed from the charge trapping dielectric structure 124a, 124b.

Charge stored in the charge trapping dielectric structure 124a, 124b of a memory cell device 102a, 102b screens an electric field formed between the memory gate 114a, 114b and the channel region 110a, 110b when the memory gate 114a, 114b is biased. This has an effect of increasing the threshold voltage $V_{th}$ of the memory cell device 102a, 102b by an amount $\Delta V_{th}$. During a read operation, a voltage is applied to the control gate 112a, 112b to induce part of the channel region 110a, 110b to conduct. Application of a voltage to the control gate 112a, 112b attracts carriers to part of the channel region 110a, 110b adjacent to the control gate 112a, 112b. Further, a voltage greater than $V_{th}$, but less than $V_{th}+\Delta V_{th}$, is applied to the memory gate 114a, 114b. If the memory cell device 102a, 102b turns on (i.e., allows charge to flow), then it stores a first data state (e.g., a logical "0"). If the memory cell device 102a, 102b does not turn on, then it stores a second data state (e.g., a logical "1").

Figure 2:
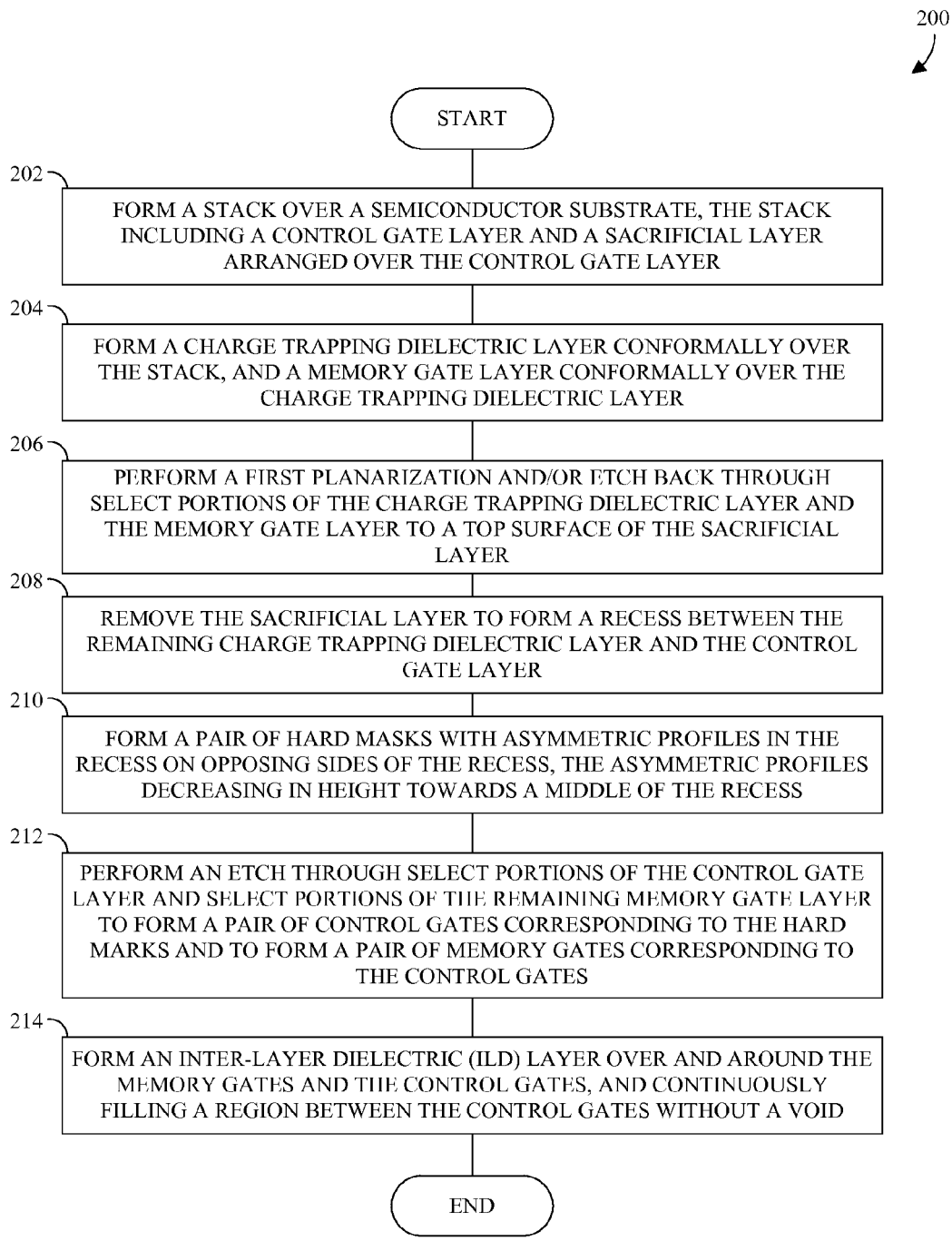
FIG. 2 illustrates a flow chart of some embodiments of a method of manufacturing a semiconductor structure for a pair of split gate flash memory cells with hard masks having asymmetric profiles.

With reference to FIG. 2, a flow chart 200 provides some embodiments of a method for manufacturing a semiconductor structure for a pair of split gate flash memory cells with hard masks having asymmetric profiles. An example of the semiconductor structure is shown in FIG. 1.

A stack is formed (Action 202) over a semiconductor substrate. The stack includes a control gate layer and a sacrificial layer arranged over the control gate layer.

A charge trapping dielectric layer is formed (Action 204) conformally over the stack, and a memory gate layer is formed (Action 204) conformally over the charge trapping dielectric layer.

A first planarization and/or etch back is performed (Action 206) through select portions of a charge trapping dielectric layer and the memory gate layer to a top surface of the sacrificial layer.

The sacrificial layer is removed (Action 208) to form a recess between the remaining charge trapping dielectric layer and the control gate layer.

A pair of hard masks with asymmetric profiles are formed (Action 210) in the recess on opposing sides of the recess. The asymmetric profiles decrease in height towards a middle of the recess. As seen hereafter, the hard masks advantageously act as spacers to define the width of a central region between control gates.

An etch is concurrently performed (Action 212) through select portions of the control gate layer and select portions of the remaining memory gate layer to form a pair of control gates corresponding to the hard marks and to form a pair of memory gates corresponding to the control gates. These select portions include portions of the control gate layer in the central region and peripheral portions of the remaining memory gate layer. During the first etch, the hard masks mask the control gate layer so unmasked portions are etched to define a central region between the control gates.

An ILD layer (Action 214) is formed over and around the memory gates and the control gates, and continuously filling a region between the control gates without a void.

While the disclosed methods (e.g., the method described by the flowchart 200) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

With reference to FIGS. 3-15, cross-sectional views of some embodiments of a semiconductor structure at various stages of manufacture are provided to illustrate the method. Although FIGS. 3-15 are described in relation to the method, it will be appreciated that the structures disclosed in FIGS. 3-15 are not limited to the method, but instead may stand alone as structures independent of the method. Similarly, although the method is described in relation to FIGS. 3-15, it will be appreciated that the method is not limited to the structures disclosed in FIGS. 3-15, but instead may stand alone independent of the structures disclosed in FIGS. 3-15.

Figure 3:
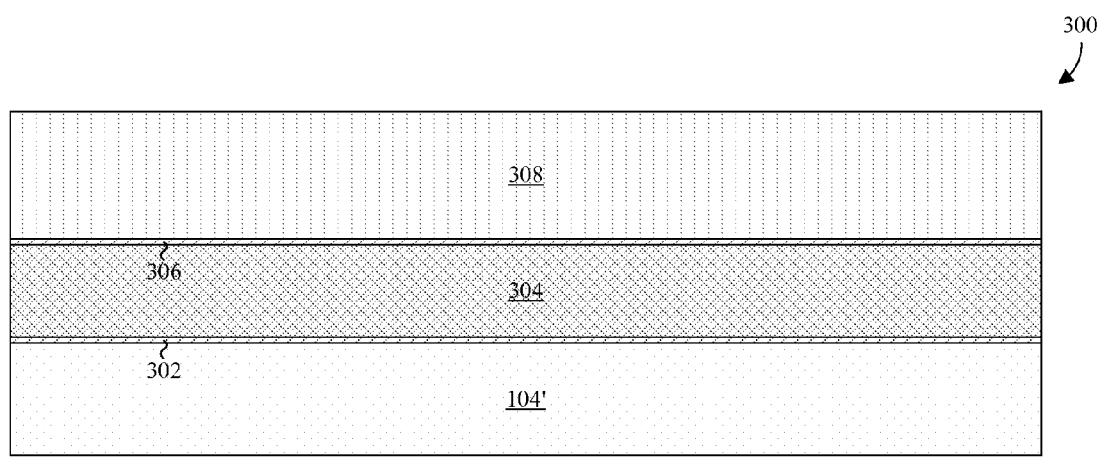
FIGS. 3-15 illustrate a series of cross-sectional views of some embodiments of a semiconductor structure at various stages of manufacture for a pair of split gate flash memory cells with hard masks having asymmetric profiles.
Figure 4:
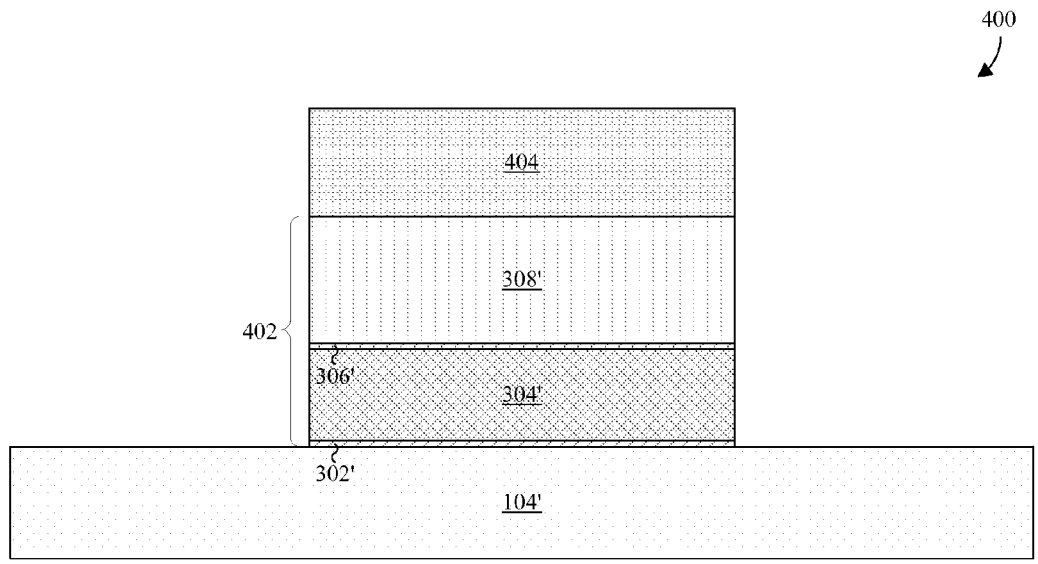

FIGS. 3 and 4 illustrate cross-sectional views 300 and 400 of some embodiments corresponding to Action 202.

A shown by FIG. 3, a semiconductor substrate 104' is provided. The semiconductor substrate 104' is, for example, a bulk substrate of silicon, germanium, or group III and group V elements. Alternatively, the semiconductor substrate 104' is, for example, a semiconductor-on-insulator (SOI) substrate.

Also shown by FIG. 3, a first dielectric layer 302, a control gate layer 304, a second dielectric layer 306, and a first sacrificial layer 308 are formed in that order over the semiconductor substrate 104'. The first and second dielectric layers 302, 306, the control gate layer 304, and the first sacrificial layer 308 are typically uniform in thickness. In some embodiments, the control gate layer 304 has a thickness of about 80 nanometers, and the first sacrificial layer 308 has a thickness of about 110 nanometers. The first and second dielectric layers 302, 306 are, for example, an oxide, such as silicon dioxide. For SONOS split gate flash memory cells, the control gate layer 304 is, for example, a silicon based material, such as polysilicon. For a MONOS split gate flash memory cell, the control gate layer 304 is, for example, a metal or metal alloy. The first sacrificial layer is 308, for example, silicon nitride or a multilayer nitride-oxide-nitride (NON) film.

As shown by FIG. 4, a first etch is performed through select portions of the first and second dielectric layers 302, 306, the control gate layer 304, and the first sacrificial layer 308 to form a stack 402. The select portions include those portions outside the boundaries of the stack 402. The stack 402 has a width about equal to the distance between control gate sidewalls corresponding to memory cell devices of a pair of SONOS or MONOS memory cell devices and facing corresponding memory gates of the memory cell devices. For example, with width of the stack 402 is about 370 nanometers. In some embodiments, the first etch includes forming a first photoresist layer over a top surface of the hard mask layer 308, patterning the first photoresist layer, and applying an etchant to the patterned first photoresist layer 404 to form the stack 402.

Figure 5:
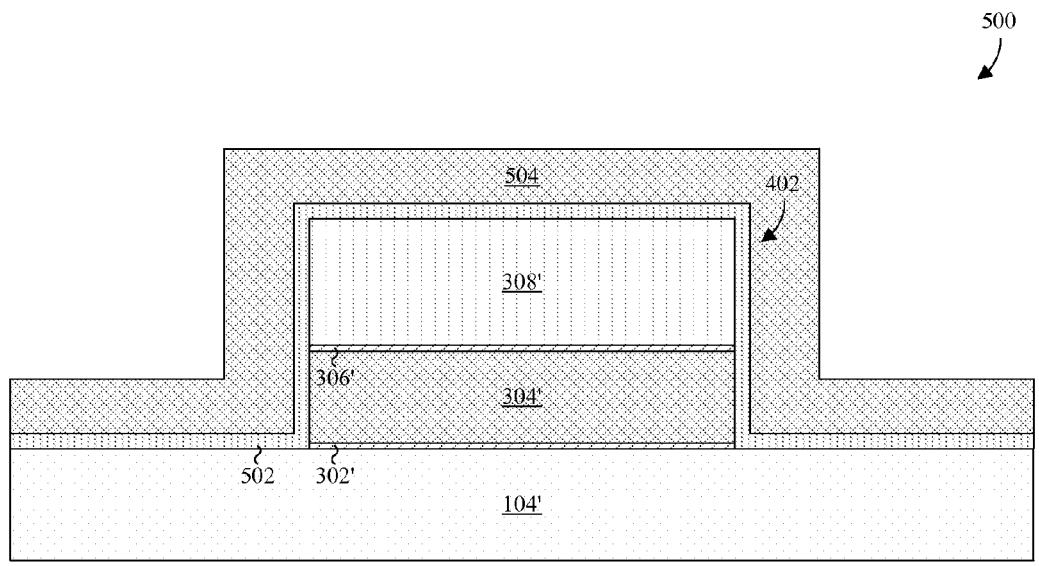

FIG. 5 illustrates a cross-sectional view 500 of some embodiments corresponding to Action 204. As shown by FIG. 5, a charge trapping dielectric layer 502 is conformally formed over the semiconductor substrate 104' and the stack 402. Further, a memory gate layer 504 is conformally formed over the charge trapping dielectric layer 502. In some embodiments, the memory gate layer 504 has a thickness of about 60 nanometers along sidewalls of the stack 402. The charge trapping dielectric layer 502 is, for example, a multilayer charge trapping dielectric, such as an ONO dielectric or an OSiO dielectric. For SONOS split gate flash memory cells, the memory gate layer 504 is, for example, a silicon based material, such as polysilicon. For a MONOS split gate flash memory cell, the memory gate layer 504 is, for example, a metal or metal alloy.

Figure 6:
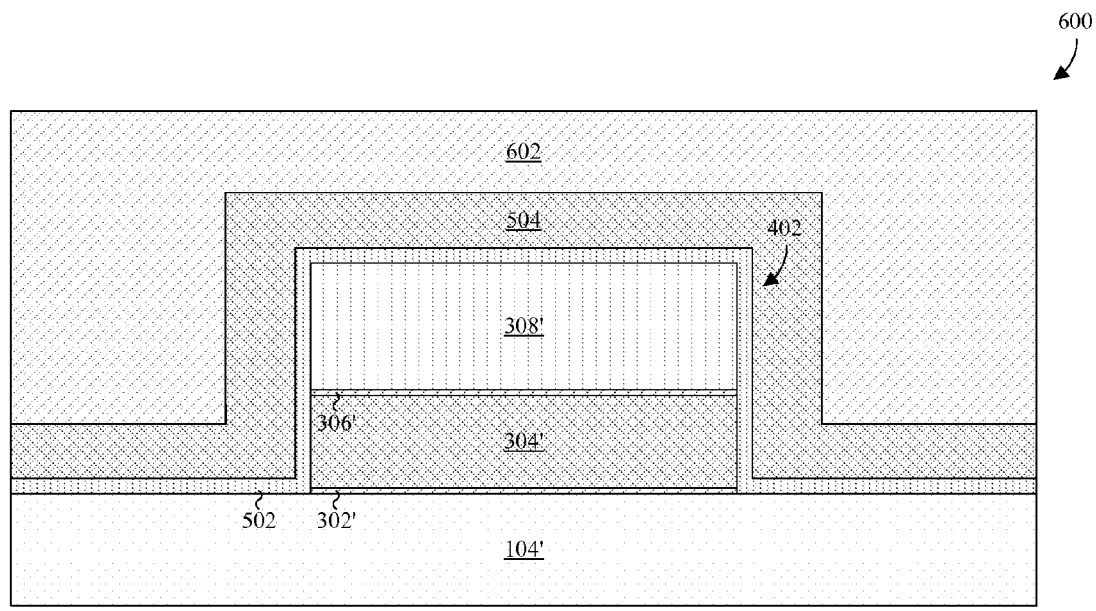
Figure 7:
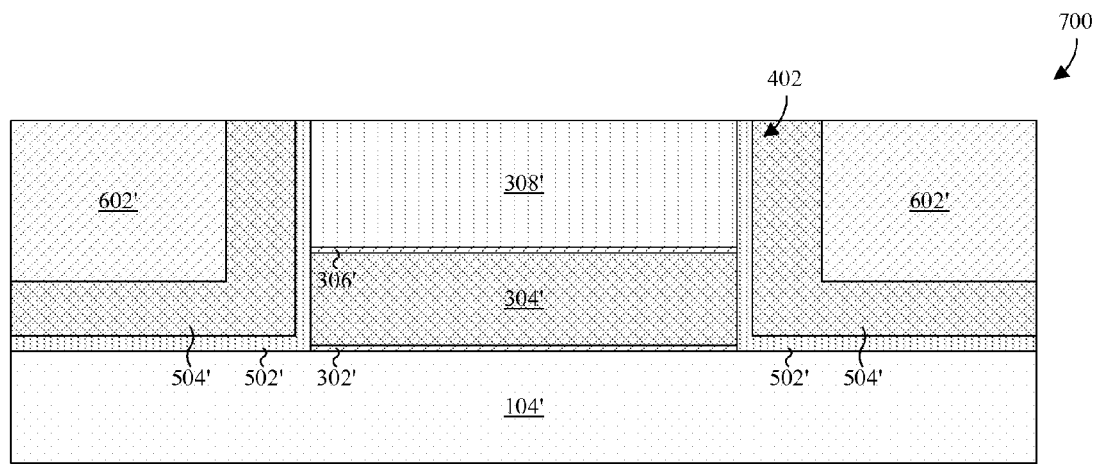

FIGS. 6 and 7 illustrate cross-sectional views 600, 700 of some embodiments corresponding to Action 206.

As shown by FIG. 6, a second sacrificial layer 602 is formed over and around the memory gate layer 504. The second sacrificial layer 602 is, for example, an oxide, such as silicon dioxide.

As shown by FIG. 7, a first planarization and/or etch back is performed into the second sacrificial layer 602, and through portions of the memory gate layer 504 and the charge trapping dielectric layer 502, to a top surface of the remaining first sacrificial layer 308'.

Figure 8:
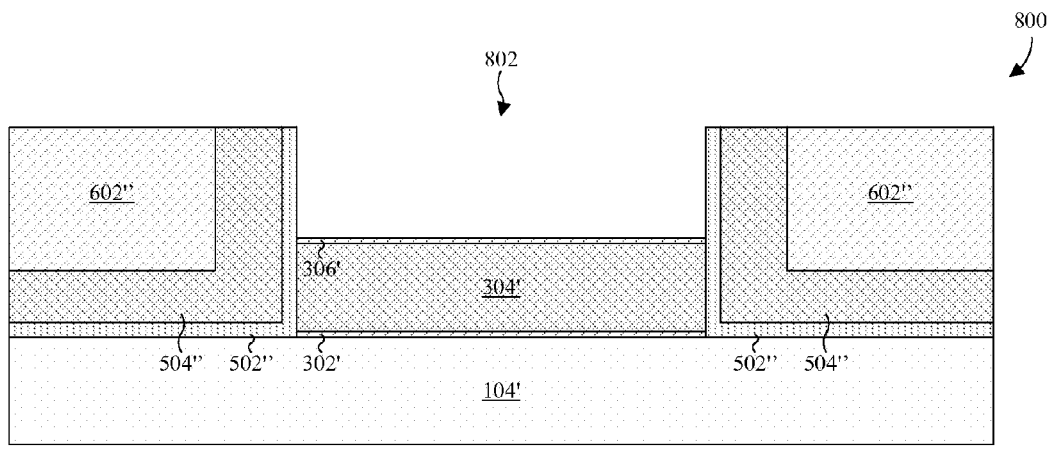

FIG. 8 illustrates a cross-sectional view 800 of some embodiments corresponding to Action 208. As shown by FIG. 8, a second etch is performed through the remaining first sacrificial layer 308' to remove the remaining first sacrificial layer 308' and to form a recess 802 between the remaining charge trapping dielectric layer 502'. In some embodiments, the recess 802 has a depth of about 100 nanometers. Further, in some embodiments, the second etch reduces the height of the remaining charge trapping dielectric 502' layer, the remaining memory gate layer 504', and the remaining second sacrificial layer 602'.

Figure 9:
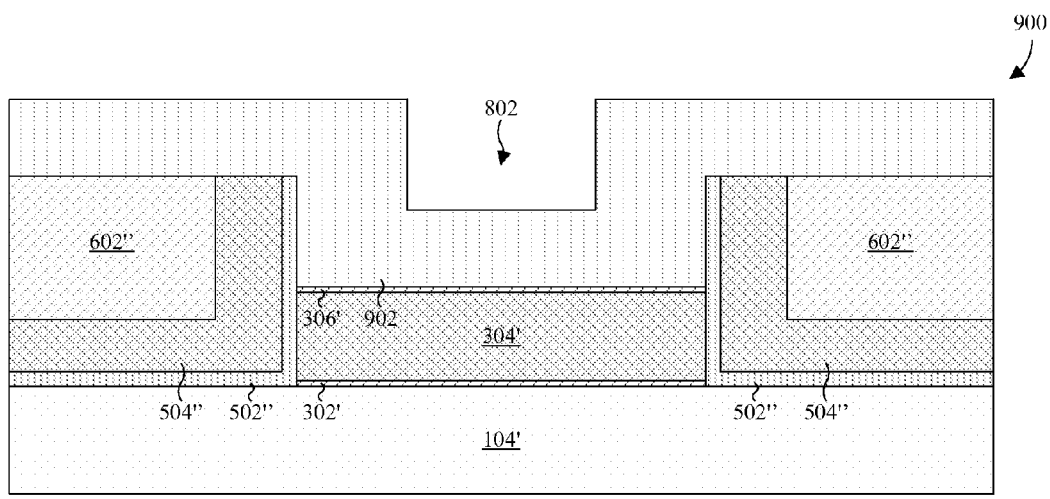
Figure 10:
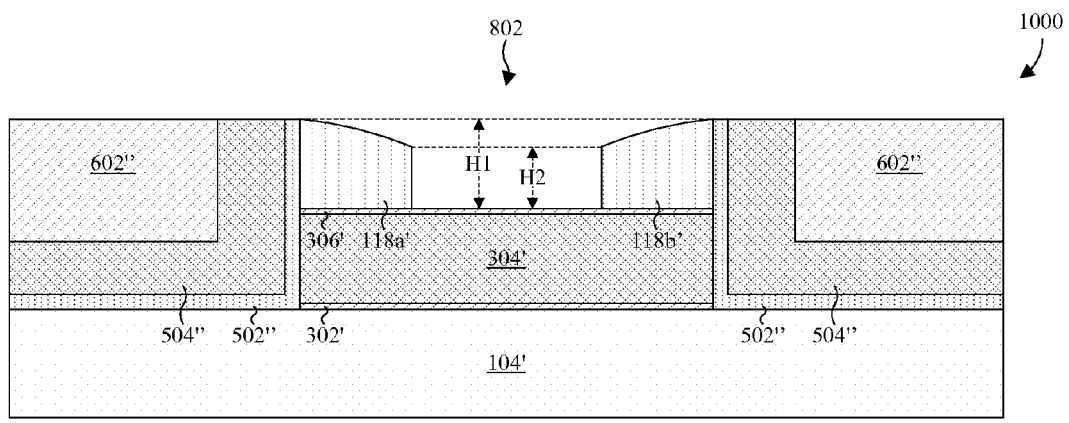

FIGS. 9 and 10 illustrate cross-sectional views 900 and 1000 of some embodiments corresponding to Action 210.

As shown by FIG. 9, a hard mask layer 902 is formed conformally lining the recess 802 and over the remaining second sacrificial layer 602", the remaining memory gate layer 504", and the remaining charge trapping dielectric layer 502". As described hereafter, the thickness of the hard mask layer 902 defines the distance between control gates. In some embodiments, the hard mask layer 902 has a thickness of about 100 nanometers along sidewalls of the recess 802. The hard mask layer 902 is, for example, silicon nitride or a multilayer NON film.

As shown by FIG. 10, a third etch is performed through select portions of the hard mask layer 902 to form a pair of hard masks 118a', 118b' in the recess 802 on opposing sides of the recess 802'. The hard masks 118a', 118b' have asymmetric profiles decreasing in height towards the middle of the recess 802 and, as described hereafter, act as spacers to define the distance between neighboring control gates. In some embodiments, the asymmetric profiles include a first height H1 of about 80 nanometers at a first sidewall proximate to the remaining charge trapping dielectric layer 502", and include a second height H2 of about 55 nanometers at a second sidewall proximate to a middle of the recess 802 and opposite the first sidewall. In contrast with traditional hard masks, the hard masks 118a', 118b' of the present disclosure are not subsequently removed.

The select portions of the third etch include horizontal stretches of the hard mask layer 902, while excluding vertical stretches lining sidewalls of the remaining charge trapping dielectric layer 502". These horizontal stretches include, for example, those portions of the hard mask layer 902 arranged over the remaining second sacrificial layer 602", the remaining charge trapping dielectric layer 502", the remaining memory gate layer 504", and the remaining second dielectric layer 306' in a middle of the recess 802. In some embodiments, the third etch reduces the height of the remaining charge trapping dielectric layer 502", the remaining memory gate layer 504", and the remaining second sacrificial layer 602".

Figure 11:
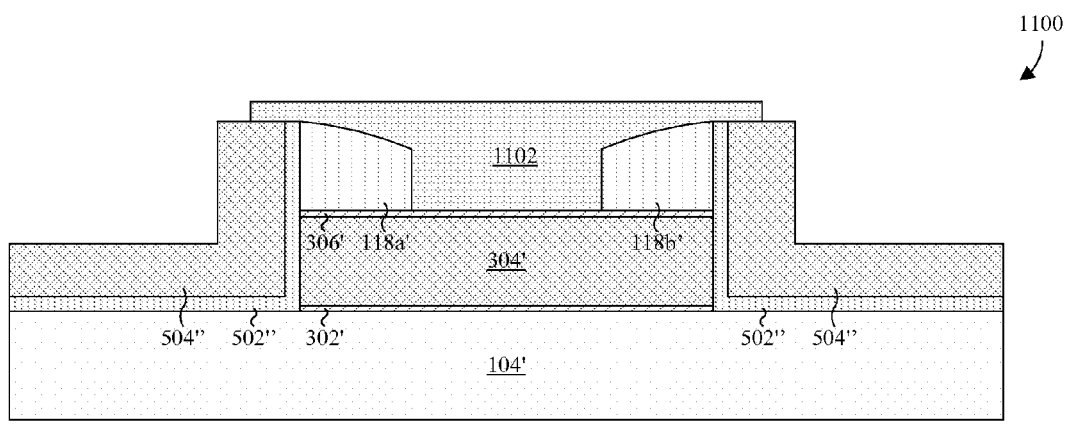
Figure 12:
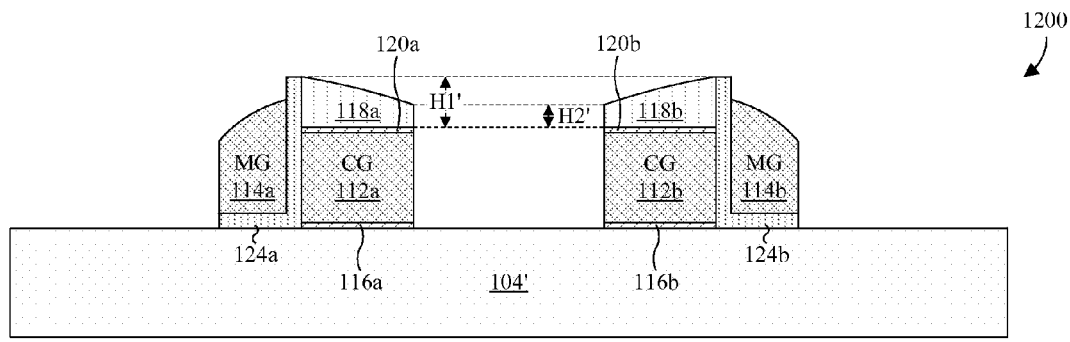

FIGS. 11 and 12 illustrate cross-sectional views 1100 and 1200 of some embodiments corresponding to Action 212.

As shown by FIG. 11, a fourth etch is performed through the remaining second sacrificial layer 602" to remove the remaining second sacrificial layer 602". In some embodiments, the fourth etch includes forming a second photoresist layer over a top surface of the remaining charge trapping dielectric layer 502", the remaining memory gate layer 504", and the recess 802. The second photoresist layer is then patterned and an etchant is applied to the patterned second photoresist layer 1102. The etchant is, for example, hydrofluoric acid.

As shown by FIG. 12, a fifth etch is performed through select portions of the remaining control gate layer 304' and the remaining first and second dielectric layers 302', 306'. The select portions of the of the remaining control gate layer 304' and the remaining first and second dielectric layers 302', 306' include those portions unmasked by the hard masks 118a', 118b'. The fifth etch concurrently forms a pair of control gates 112a, 112b under the hard masks 118a', 118b', as well as corresponding hard mask dielectric structures 120a, 120b arranged between the control gates 112a, 112b and the hard masks 118a', 118b' and corresponding control gate dielectric structures 116a, 116b arranged between the control gates 112a, 112b and the semiconductor substrates 104. In this way, the hard masks 118a', 118b' serve as masks during the fifth etch, as well as spacers to define the spacing between the control gates 112a, 112b.

In some embodiments, the fifth etch extends into the hard masks 118a', 118b' to reduce the height of the asymmetric profiles of the hard masks 118a', 118b'. For example, after the fifth etch, the asymmetric profiles of the remaining hard masks 118a, 118b include a remaining first height H1' of about 45 nanometers at a first sidewall proximate to the remaining charge trapping dielectric layer 502", and include a remaining second height H2' of about 20 nanometers at a second sidewall proximate to a middle of the recess 802 and opposite the first sidewall.

The fifth etch is further performed through select portions of the remaining memory gate layer 504" to form a pair of memory gates 114a, 114b corresponding to the control gates 112a, 112b. The select portions of the remaining memory gate layer 504" include horizontal stretches of the remaining memory gate layer 504" while excluding vertical stretches lining sidewalls of the remaining charge trapping dielectric layer 502".

Also shown by FIG. 12, a sixth etch is performed through select portions of the remaining charge trapping dielectric layer 502" to form charge trapping dielectric structures 124a, 124b corresponding to the memory gates 114a, 114b. The charge trapping dielectric structures 124a, 124b are arranged under the corresponding memory gates 114a, 114b and between the corresponding memory gates 114a, 114b and the control gates 112a, 112b. The select portions of the sixth etch include horizontal stretches of the remaining charge trapping dielectric layer 502" uncovered by the memory gates 114a, 114b.

Figure 13:
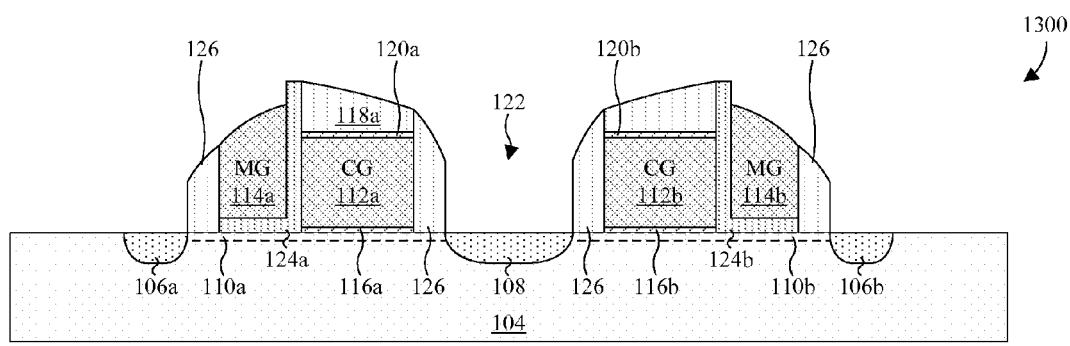
Figure 14:
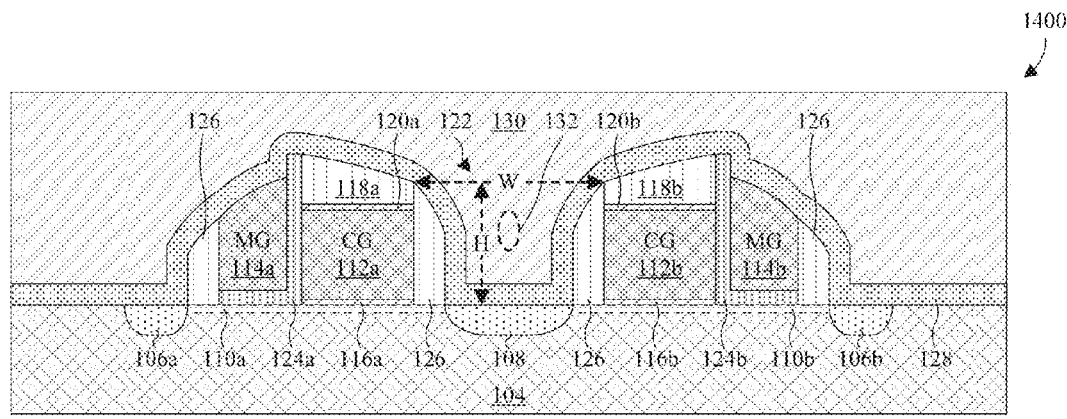

FIGS. 13 & 14 illustrate cross-sectional views 1300 and 1400 of some embodiments corresponding to Action 214.

As shown by FIG. 13, a main sidewall structure 126 is formed along sidewalls of the control gates 112a, 112b in a central region 122 between the control gates 112a, 112b, and along sidewalls of the charge trapping dielectric structures 124a, 124b and the memory gates 114a, 114b outside the central region 122. The main sidewall structure 126 is formed by, for example, conformally forming an intermediate dielectric layer and selectively etching the intermediate dielectric layer to form the main sidewall structure 126. The main sidewall structure 126 is, for example, a dielectric, such as silicon nitride.

Also shown by FIG. 13, source/drain regions 106a, 106b, 108 are embedded within the semiconductor substrate 104 to define channel regions 110a, 110b. This includes embedding a common source/drain region 108 in the central region 122. As described above, the hard masks 118a, 118b serve as spacers to define this central region 122 and hence the size of the common source/drain region 108. The use of spacers is advantageously because it allows more accurate dimensioning of the central region 122 relative to current lithographic approaches to defining the central region 122.

As shown by FIG. 14, a contact etch stop layer 128 is conformably formed over the modified semiconductor substrate 104 (modified with the source/drain regions 106a, 106b, 108). The contact etch stop layer 128 runs along top surfaces of the main sidewall structure 126, the modified semiconductor substrate 104, the memory gates 114a, 114b, the charge trapping dielectric structures 124a, 124b and the remaining hard masks 118a, 118b. The contact etch stop layer 128 also runs along sidewalls of the main sidewall structure 126. Further, a first ILD layer 130 is formed over the contact etch stop layer 128 and filling the central region 122.

Advantageously, the risk of a void 132 forming in the central region 122 during the formation of the ILD layer 130 is reduced because the remaining hard masks 118a, 118b have asymmetrical profiles decreasing in height towards the central region 122 between the control gates 112a, 112b. The asymmetrical profiles reduce the aspect ratio (i.e., the ratio of height H to width W) of the central region 122, which allows improved filling of the central region 122 with the first ILD layer 130 and a reduced likelihood of device failure. In some embodiments, the width W corresponds to the distance between neighboring sidewalls of the control gates 112a, 112b, and the height H corresponds to the distance between a top surface of the modified semiconductor substrate 104 and the lowest point of the top surface of the remaining hard masks 118a, 118b.

Figure 15:
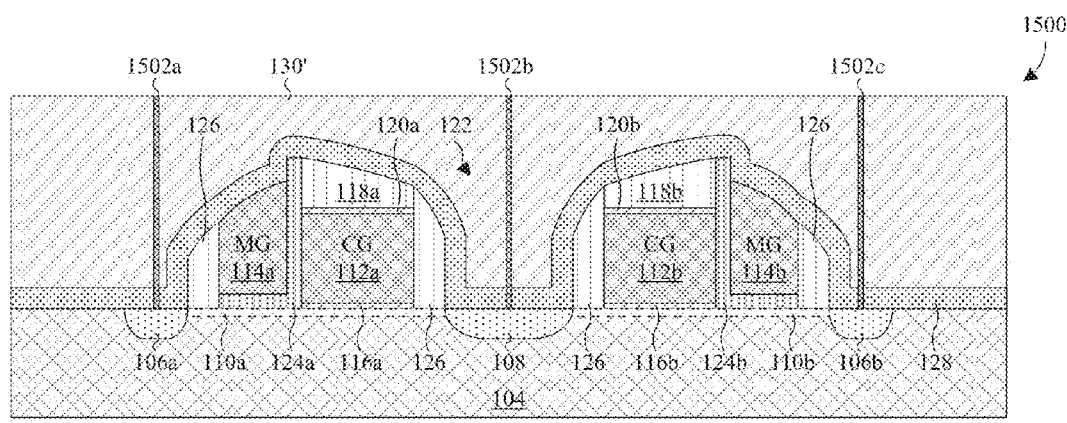

FIG. 15 illustrates a cross-sectional view 1500 of some embodiments corresponding to actions performed after the method. As shown by FIG. 15, conductive contacts 1502a-c extending vertically down through the remaining ILD layer 130' to the source/drain regions 106a, 106b, 108 are formed.

Thus, as can be appreciated from above, the present disclosure provides a semiconductor structure for a split gate flash memory cell device. A semiconductor substrate of the semiconductor structure includes a first source/drain region and a second source/drain region. A control gate and a memory gate, of the semiconductor structure, are spaced over the semiconductor substrate between the first and second source/drain regions. A charge trapping dielectric structure of the semiconductor structure is arranged between neighboring sidewalls of the memory gate and the control gate, and arranged under the memory gate. A hard mask of the semiconductor structure is arranged over the control gate and includes an asymmetric profile. The asymmetric profile tapers in height away from the memory gate.

In other embodiments, the present disclosure provides a method for manufacturing a split gate flash memory cell. A stack is formed over a semiconductor substrate. The stack includes a control gate layer and a sacrificial layer arranged over the control gate layer. A charge trapping dielectric layer is conformally formed over the stack and a memory gate layer is conformally formed over the charge trapping dielectric layer. The sacrificial layer is removed to form a recess between the charge trapping dielectric layer and the control gate. A pair of hard masks is formed in the recess on opposite sides of the recess. The hard masks have asymmetric profiles decreasing in height towards a middle of the recess and not covering a central portion of the control gate layer. The central portion of the control gate layer is removed to form a pair of control gates masked by the hard masks, and peripheral portions of the memory gate layer are concurrently removed to form a pair of memory gates corresponding to the control gates.

In yet other embodiments, the present disclosure provides a semiconductor structure for a pair of split gate flash memory cell devices. A semiconductor substrate includes a first source/drain region, a second source/drain region, and a third source/drain region arranged on an opposite side of the second source/drain region as the first source/drain region. First and second control gates and corresponding first and second memory gates are spaced over the semiconductor substrate between the second source/drain region and corresponding ones of the first and third source/drain regions. First and second charge trapping dielectric structures correspond to the first and second memory gates and correspond to the first and second control gates. The first and second charge trapping dielectric structures are arranged between neighboring sidewalls of the corresponding memory gates and the corresponding controls gates. The first and second charge trapping dielectric structures are arranged under the corresponding memory gates. First and second hard masks are arranged correspondingly over the first and second control gates and include an asymmetric profile. The asymmetric profile tapers in height towards the second source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure for a split gate flash memory cell device, the semiconductor structure comprising:
    a semiconductor substrate including a first source/drain region and a second source/drain region;
    a control gate and a memory gate spaced over the semiconductor substrate between the first and second source/drain regions;
    a charge trapping dielectric structure arranged between the memory gate and the control gate, and arranged under the memory gate; and
    a hard mask arranged over the control gate and including an asymmetric profile, the asymmetric profile tapering in height away from the memory gate, wherein the hard mask is a dielectric and shares a width with the control gate, and wherein the hard mask and the control gate share a first common sidewall on a first side of the control gate and a second common sidewall on a second side of the control gate that is opposite the first side.

2. The semiconductor structure according to claim 1, wherein the asymmetric profile includes a first height at a first side proximate to the charge trapping dielectric structure, and a second height at a second side opposite the first side, and wherein the second height is less than the first height.

3. The semiconductor structure according to claim 1, further including:
a main sidewall structure arranged along the memory gate and the control gate;
a contact etch stop layer conformally arranged over the main sidewall structure, the charge trapping dielectric structure, the memory gate, and the hard mask; and
an inter-layer dielectric (ILD) layer arranged over and around the memory gate, the hard mask, the charge trapping dielectric structure, the control gate, the main sidewall structure, and the contact etch stop layer.

4. The semiconductor structure according to claim 1, wherein the semiconductor substrate includes a third source/drain region arranged on an opposite side of the second source/drain region as the first source/drain region, and wherein the semiconductor structure further includes:
a second control gate and a second memory gate spaced between the second and third source/drain regions;
a second charge trapping dielectric structure arranged between the second memory gate and the second control gate, and arranged under the second memory gate; and
a second hard mask arranged over the second control gate and including a second asymmetric profile, the second asymmetric profile tapering in height away from the second memory gate.

5. The semiconductor structure according to claim 4, wherein the asymmetric profile and the second asymmetric profile decrease in height towards the second source/drain region.

6. The semiconductor structure according to claim 4, further including:
an inter-layer dielectric (ILD) layer continuously filling a central region between the control gate and the second control gate, the central region including a ratio of height to width less than about one.

7. The semiconductor structure according to claim 1, further comprising:
a main sidewall structure arranged along the control gate, wherein the charge trapping dielectric structure and the main sidewall structure respectively have a first vertical sidewall and a second vertical sidewall, and wherein the hard mask contacts the first and second vertical sidewalls respectively at the first and second common sidewalls, and wherein the hard mask extends laterally from the first vertical sidewall to the second vertical sidewall.

8. The semiconductor structure according to claim 1, further comprising:
a hard mask dielectric layer arranged vertically between the control gate and the hard mask to space the hard mask from the control gate, wherein the hard mask dielectric layer shares the width with the hard mask and the control gate.

9. A semiconductor structure for a pair of split gate flash memory cell devices, the semiconductor structure comprising:
a semiconductor substrate including a first source/drain region, a second source/drain region, and a third source/drain region arranged on an opposite side of the second source/drain region as the first source/drain region;
first and second control gates and corresponding first and second memory gates spaced over the semiconductor substrate between the second source/drain region and corresponding ones of the first and third source/drain regions, wherein the first and second control gates respectively comprise first sidewalls and respectively comprise second sidewalls, and wherein the second sidewalls of the first and second control gates are adjacent to the second source/drain region and respectively opposite the first sidewalls of the first and second control gates;
first and second charge trapping dielectric structures corresponding to the first and second memory gates and corresponding to the first and second control gates, wherein the first and second charge trapping dielectric structures are arranged between the corresponding memory gates and the corresponding controls gates, and wherein the first and second charge trapping dielectric structures are arranged under the corresponding memory gates and respectively comprise sidewalls; and
first and second hard masks arranged correspondingly over the first and second control gates and including an asymmetric profile, the asymmetric profile tapering in height towards the second source/drain region, wherein the first and second hard masks are dielectric and extend laterally respectively from the first sidewalls of the first and second control gates respectively to the second sidewalls of the first and second control gates, and wherein the first and second hard masks respectively comprise first sidewalls that respectively contact the sidewalls of the first and second charge trapping dielectric structures.

10. The semiconductor structure according to claim 9, wherein the asymmetric profile includes a first height proximate to the first and second charge trapping dielectric structures, and a second height proximate the second source/drain region, and wherein the second height is less than the first height.

11. The semiconductor structure according to claim 9, further comprising:
a main sidewall structure arranged along the first and second memory gates, and further arranged along the second sidewalls of the first and second control gates;
a contact etch stop layer conformally arranged over the main sidewall structure, the first and second charge trapping dielectric structures, the first and second memory gates, and the first and second hard masks; and
an inter-layer dielectric (ILD) layer arranged over and around the first and second memory gates, the first and second hard masks, the first and second charge trapping dielectric structures, the first and second control gates, the main sidewall structure, and the contact etch stop layer.

12. The semiconductor structure according to claim 9, further comprising:
an inter-layer dielectric (ILD) layer continuously filling a central region between the first and second control gates, the central region including a ratio of height to width less than about one.

13. The semiconductor structure according to claim 9, further comprising:

a first hard mask dielectric layer and a second hard mask dielectric layer arranged vertically between respective ones of the first and second control gates and respective ones of the first and second hard masks to space the first and second hard masks from the first and second control gates, wherein the first and second hard masks, the first and second control gates, and the first and second hard mask dielectric layers share a width.

14. The semiconductor structure according to claim 9, wherein the first and second hard masks respectively comprise second sidewalls that are respectively on opposite sides of the first and second hard masks as the first sidewalls of the first and second hard masks, and wherein the semiconductor structure further comprises:
a main sidewall structure arranged along the first and second control gates, wherein the main sidewall structure comprises sidewalls that respectively contact the second sidewalls of the first and second control gates and that respectively contact the second sidewalls of the first and second hard masks.

15. The semiconductor structure according to claim 14, wherein the first sidewalls of the first and second hard masks are respectively aligned with the first sidewalls of the first and second control gates, and wherein the second sidewalls of the first and second hard masks are respectively aligned with the second sidewalls of the first and second control gates.

16. A split gate flash memory cell device comprising:
a pair of source/drain regions arranged in an upper side of a semiconductor substrate;
a control gate and a memory gate arranged over the semiconductor substrate and laterally spaced between the source/drain regions, wherein the control gate comprises a first sidewall and a second sidewall respectively arranged on opposite sides of the control gate;
a charge trapping dielectric layer arranged between the control and memory gates, and arranged under the memory gate;
an asymmetric hard mask arranged over the control gate, wherein the asymmetric hard mask is a dielectric and extends laterally from the first sidewall of the control gate to the second sidewall of the control gate, wherein a height of the asymmetric hard mask decreases from the first sidewall of the control gate to the second sidewall of the control gate, and wherein the asymmetric hard mask comprises a first sidewall;
a main sidewall structure comprising a sidewall that contacts the second sidewall of the control gate and the first sidewall of the asymmetric hard mask at locations offset from a to edge of the sidewall; and
an interlayer dielectric (ILD) layer covering the control and memory gates and the asymmetric hard mask.

17. The split gate flash memory cell device according to claim 16, further comprising:
a second control gate arranged on an opposite side of one of the source/drain regions as the control gate; and
a second asymmetric hard mask arranged over the second control gate;
wherein a ratio of height to width of a region between the control gate and the second control gate is less than about one.

18. The split gate flash memory cell device according to claim 17, wherein a height of the second asymmetric hard mask tapers towards the one of the source/drain regions.

19. The split gate flash memory cell device according to claim 16, wherein the asymmetric hard mask comprises a second sidewall, wherein the first and second sidewalls of the asymmetric hard mask are respectively arranged on opposite sides of the asymmetric hard mask, wherein the charge trapping dielectric layer comprises a sidewall contacting the first sidewall of the control gate and the second sidewall of the asymmetric hard mask, and wherein the split gate flash memory cell device further comprises:
a control gate dielectric structure arranged under the control gate to vertically space the control gate from the semiconductor substrate, wherein the control gate dielectric structure comprises a sidewall contacting the sidewall of the charge trapping dielectric layer.

20. The split gate flash memory cell device according to claim 16, wherein the asymmetric hard mask comprises a second sidewall, wherein the first and second sidewalls of the asymmetric hard mask are respectively arranged on opposite sides of the asymmetric hard mask, wherein the first sidewall of the asymmetric hard mask is coplanar with the second sidewall of the control gate, and wherein the second sidewall of the asymmetric hard mask is coplanar with the first sidewall of the control gate.

* * * * *